United States Patent
Wohlfahrt et al.

(10) Patent No.: US 6,800,890 B1
(45) Date of Patent: Oct. 5, 2004

(54) MEMORY ARCHITECTURE WITH SERIES GROUPED BY CELLS

(75) Inventors: Joerg Wohlfahrt, Kanagawa (JP); Rainer Bruchhaus, Kanagawa (JP); Andreas Hilliger, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/248,234

(22) Filed: Dec. 30, 2002

(51) Int. Cl.⁷ .......................................... H01L 27/108
(52) U.S. Cl. ...................... 257/295; 257/200; 257/306; 257/310
(58) Field of Search ................. 257/200, 295, 257/306, 310, 308, 311; 365/145, 149

(56) References Cited

U.S. PATENT DOCUMENTS

| | | | |
|---|---|---|---|
| 5,903,492 A | * | 5/1999 | Takashima .................. 365/145 |
| 6,211,005 B1 | * | 4/2001 | Kang ......................... 438/238 |
| 6,376,325 B1 | * | 4/2002 | Koo ........................... 438/396 |
| 6,507,510 B2 | * | 1/2003 | Takashima .................. 365/145 |
| 6,521,929 B2 | * | 2/2003 | Ozaki ......................... 257/295 |
| 6,603,161 B2 | * | 8/2003 | Kanaya et al. .............. 257/295 |

* cited by examiner

*Primary Examiner*—David Nelms
*Assistant Examiner*—Dao H. Nguyen
(74) *Attorney, Agent, or Firm*—Horizon IP Pte Ltd (57) ABSTRACT

An IC with a memory array having a series architecture is disclosed. A memory cell of a series group comprises a transistor coupled to a capacitor in parallel. The capacitor includes first and second subcapacitors, one stacked one on top of the other. Providing a capacitor with two or more subcapacitors in a stack advantageously increases the capacitance of a capacitor without increasing surface area.

14 Claims, 8 Drawing Sheets

MEMORY ARCHITECTURE WITH SERIES GROUPED BY CELLS

BACKGROUND OF INVENTION

Ferroelectric metal oxide ceramic materials such as lead zirconate titanate (PZT) have been investigated for use in ferroelectric semiconductor memory devices. The ferroelectric material is located between two electrodes to form a ferroelectric capacitor for storage of information. Ferroelectric capacitor uses the hysteresis polarization characteristic of the ferroelectric material for storing information. The logic value stored in a ferroelectric memory cell depends on the polarization direction of the ferroelectric capacitor. To change the polarization direction of the capacitor, a voltage which is greater than the switching voltage (coercive voltage) needs to be applied across its electrodes. The polarization of the capacitor depends on the polarity of the voltage applied. An advantage of the ferroelectric capacitor is that it retains its polarization state after power is removed, resulting in a non-volatile memory cell.

Figure 1:
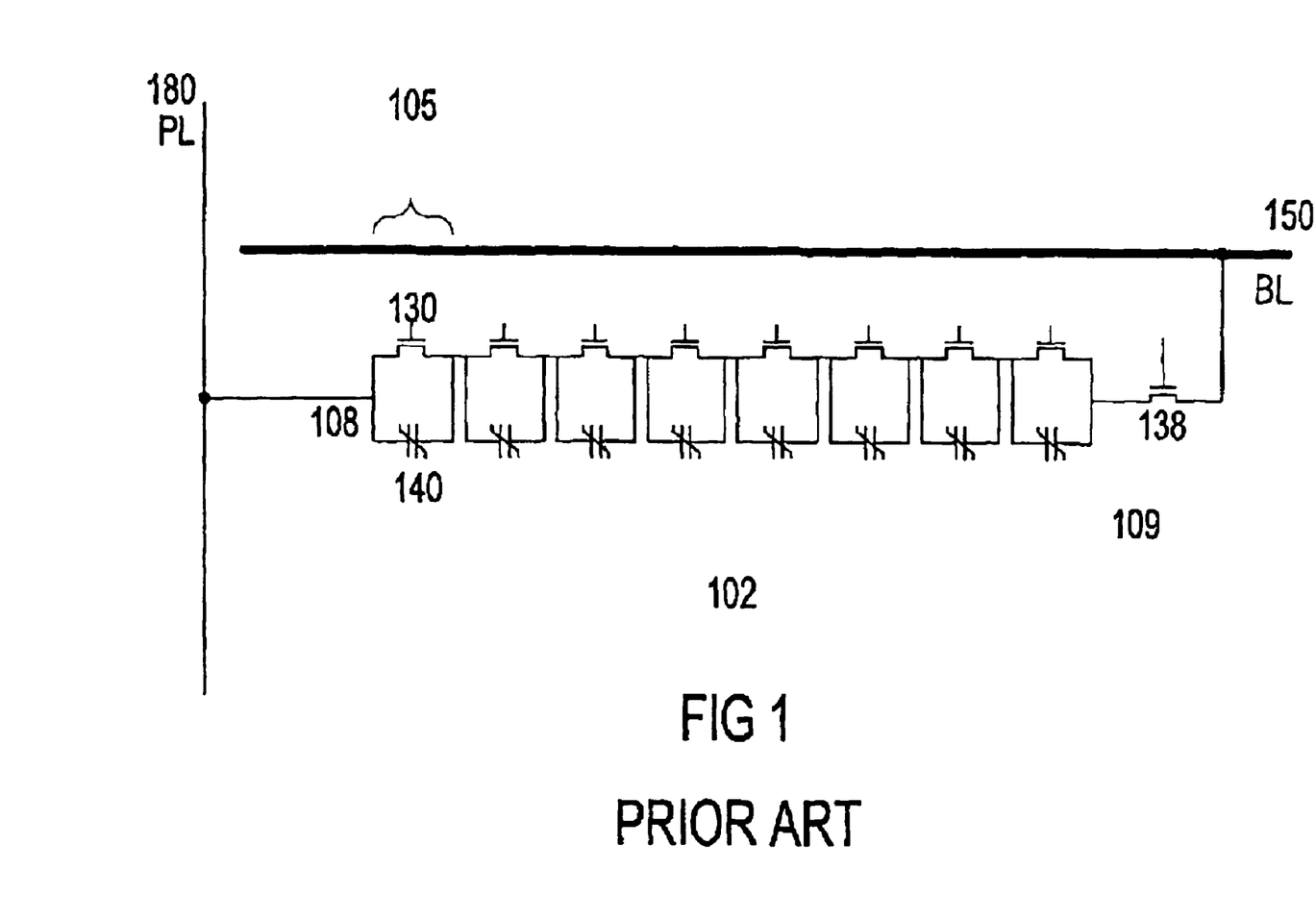
FIG. 1 shows a schematic diagram of a conventional ferroelectric memory group.

Referring to FIG. 1, a group 102 of memory cells 105 are shown. The memory cells, each with a transistor 130 coupled to a capacitor 140 in parallel, are coupled in series. Such series memory architectures are described in, for example, Takashima et al., "High Density Chain Ferroelectric Random Access Memory (chain FRAM)", IEEE Jrnl. of Solid State Circuits, vol.33, pp.787–792, May 1998, which is herein incorporated by reference for all purposes. The gates of the cell transistors can be gate conductors which are coupled to or serve as wordlines. A selection transistor 138 is provided to selectively couple one end 109 of the group to a bitline 150. A plateline 180 is coupled to the other end 108 of the group. Numerous groups are interconnected via wordlines to form a memory block. Sense amplifiers are coupled to the bitlines to facilitate access to the memory cells.

Figure 2:
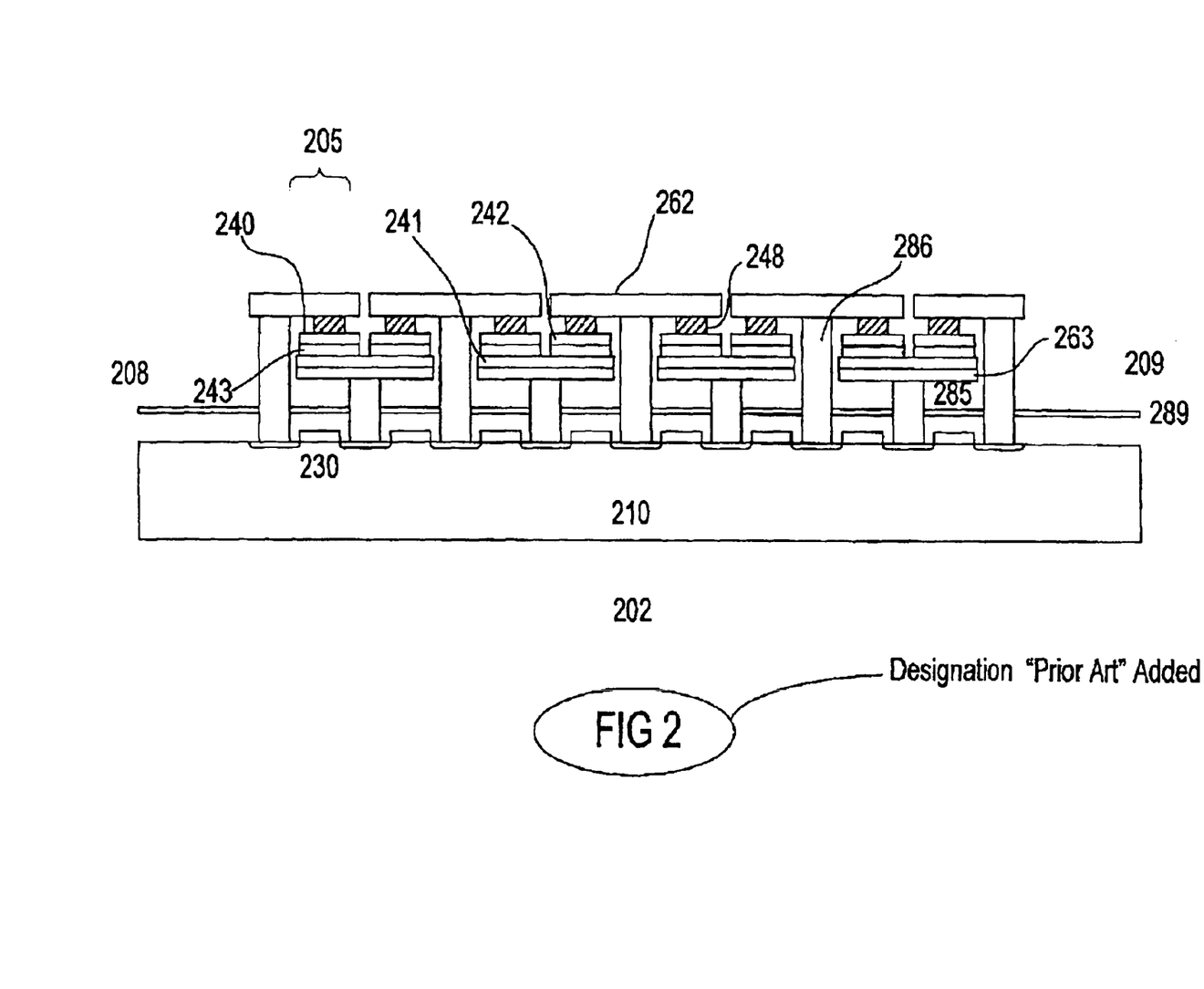
FIG. 2 shows a cross-sectional view of a conventional ferroelectric memory group.

FIG. 2 shows a cross-section of a conventional memory group 202. The transistors 230 of the memory cells 205 are formed on a substrate 210. Adjacent cell transistors shared a common diffusion region. The capacitors 240 of the memory group are arranged in pairs. The capacitors of a capacitor pair share a common bottom electrode 241. The bottom electrodes are coupled to the cell transistors via active area bottom electrode (AABE) plugs 285. The top electrode 242 of a capacitor from a capacitor pair is coupled to the top electrode of a capacitor of an adjacent pair and cell transistors. The top capacitor electrodes are coupled to the cell transistors via active area top electrode (AATE) plugs 286. Between the electrodes is a ferroelectric layer 243. A barrier layer 263, such as iridium, is located between the electrode and the AABE plug. At a first end 209 of the group is a selection transistor (not shown) having one diffusion region coupled to a bitline. The other diffusion region is a common diffusion region with the cell transistor on the end of the group. A plateline is coupled to a second end 208 of the group. A lower barrier layer 289 is located between the gate and capacitor to protect the gate stack and contact from oxidizing during high temperature processes, such as an oxygen recovery anneal.

The series architecture theoretically enables a $4F^2$ cell size, where F is the feature size. However, conventional series architectures require a sufficient capacitance to produce a sufficient read signal for sensing. To produce the necessary capacitance, a capacitor with relatively large surface area is needed. This undesirably increases the cell size to greater than $4F^2$.

From the foregoing discussion, it is desirable to provide a memory group which avoids the disadvantages of conventional series memory architectures.

SUMMARY OF INVENTION

The invention relates generally to ICs. More particularly, the invention relates to ICs with a plurality of memory cells which having a series architecture. A memory cell of a series group comprises a transistor having a gate and first and second diffusion regions and a capacitor coupled to the transistor in parallel. In one embodiment, the capacitor includes first, second, and third electrodes separated by first and second dielectric layer to form first and second subcapacitors. The second electrode is a common electrode of the first and second subcapacitors. One of the first, second or third electrodes is coupled to the second diffusion region and the other two of the first, second, or third electrodes are coupled to the first diffusion region. In one embodiment, the memory cells are ferroelectric memory cells. By providing a capacitor of memory cell with two subcapacitors, one stacked on top of the other, the capacitance of the cell capacitor can be advantageously increased without increasing the surface area.

DETAILED DESCRIPTION

Figure 3:
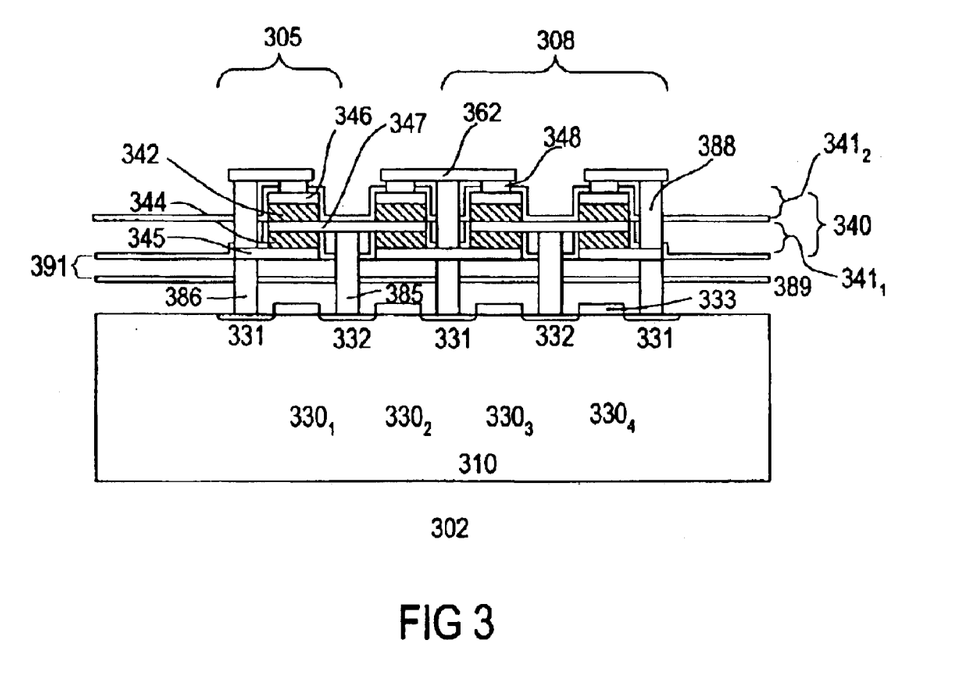
FIG. 3 shows cross-sectional view of a memory group in accordance various embodiments of the invention.

FIG. 3 shows a cross-sectional view of a portion of a group 302 of memory cells in accordance with one embodiment of the invention. The portion includes a plurality of memory cells 305 formed on a semiconductor substrate 310 comprising, for example, silicon. Illustratively, the portion includes 4 memory cells. It is understood that the group can comprise any number of memory cells (e.g., 2, 8 or 16). Preferably, the number of memory cells within a group is an even number. More preferably, the number of memory cells within a group is equal to $2^y$, where y is a whole number greater or equal to 1. Typically, y is from 2–5.

The memory cells each comprises a cell transistor 330 coupled to a capacitor 340. The transistors, in one embodiment, are n-FETs. P-FETs or other types of transistors can also be used. Each cell transistor includes a gate and first and second diffusion regions 331 and 332. In one embodiment, adjacent cell transistors share a common diffusion region. For a cell transistor which has two (e.g., first and second) adjacent cell transistors, both diffusion regions are shared with adjacent transistors. In one embodiment, adjacent cell transistors share either a common first or second diffusion region. As for the transistors at either end of the group ($330_1$ or $330_4$), only their second diffusion regions are shared with adjacent transistors. For example, the first and second cell transistors $330_1$ and $330_2$ share a common second diffusion region 332 while the second and third cell transistors $330_2$ and $330_3$ share a common first diffusion region 331.

The transistor and capacitor of a memory cell are coupled in parallel. In one embodiment, the memory cells of the group are arranged into memory cell pairs 308, each having a first memory cell with first transistor coupled to a first capacitor and a second memory cell with a second transistor coupled to a second capacitor. Of course, for groups with an odd number of cells, one would exclude from a pairing. In one embodiment, the capacitors are ferroelectric capacitors. Alternatively, other types of capacitors can be employed. For example, non-ferroelectric capacitors such as high k dielectric capacitors can be used.

In accordance with the invention, a capacitor comprises first and second subcapacitors $341_1$ and $341_2$, one stacked on top of the other. Preferably, the subcapacitors are about the same size with one located substantially directly on top of the other. Providing a capacitor with two subcapacitors in a stack results in about twice the capacitance for a given area over conventional capacitors. It is also useful to provide a capacitor with n subcapacitors arranged in a stack. For a capacitor with n subcapacitors, the capacitance can be increased about n times for a given area.

In one embodiment, a capacitor comprises first and second dielectric layers 342 and 344 between first, second, and third electrodes 345, 347, and 346. For a ferroelectric capacitor, the dielectric layers are ferroelectric layers. The ferroelectric layers, in one embodiment, comprise PZT. Strontium bismuth tantalum (SBT) or other types of ferroelectric material can also be used. Conductive materials, such as noble metals (e.g., platinum), can be used to form the electrodes. Other types of conductive materials, such as conductive oxides (e.g., SRO or IrO), can be used to form the electrodes. Alternatively, the electrode can comprise a combination of conductive materials, such as noble metal and conductive oxide. It is not necessary that the different electrodes are formed from the same type of material. In a preferred embodiment, the capacitor comprises platinum electrodes having an IrO layer between an electrode and a ferroelectric layer such as PZT.

The second electrode is shared between the two subcapacitors. One of the electrodes is shared or common with the other capacitor of the cell pair. Preferably, the common electrode of the capacitor pair is located in between the first and third electrodes, separated by dielectric layers. Providing the first or third electrode as the common electrode is also useful. In one embodiment, the common electrode of the electrode pair is coupled to the second or common diffusion region of the transistors of the cell pair via, for example, an active area common electrode (AACE) plug 385.

The first and third electrodes (non-common electrodes of the capacitor pair) are coupled to the first diffusion region of its respective cell transistor. In one embodiment, the first electrode is located below the second (common) electrode and the third electrode is located above the common electrode. The first electrode is coupled to the first diffusion region via an active area first electrode (AAFE) plug 386. As shown, an extension is provided in the first electrode for coupling to AAFE plug. The extension could be, for example, part of or is coupled to the electrode. The third electrode is coupled to the AAFE plug via the third electrode (TE) plug 348 and upper first electrode (UFE) plug 388. A conductive line 362 couples the TE and UFE plugs. The plugs typically comprise, for example, tungsten, while the conductive line comprises copper or aluminum. Other conductive materials are also useful.

Where there is another memory cell pair adjacent to a capacitor of the capacitor pair, the non-common electrodes of a capacitor is commonly coupled to the non-common electrodes of the adjacent capacitor of another memory cell pair. For example, the first and third electrodes are coupled to the first and third electrodes of the adjacent capacitor of an adjacent memory cell pair. In one embodiment, adjacent capacitors of different capacitor pairs share a common first electrode while the third electrode are coupled via a conductive strip and TE plugs. Furthermore, the conductive strip is coupled to the first electrode and AAFE plug via an UFE plug.

In one embodiment, a barrier layer (not shown) is provided between the AAFE plugs and first electrodes. The barrier layer inhibits the diffusion of oxygen which can oxidize the plug. Materials such as iridium can be used to form the barrier layer. Other types of barrier materials which inhibit diffusion of oxygen are also useful. An adhesion layer comprising, for example titanium nitride or titanium, can be provided between the barrier and ILD layer to promote adhesion. The barrier layer can also be provided in the bottom of the second (common) electrodes and AACE plugs.

An encapsulation layer 391 is provided over the capacitors. The encapsulation layer, in one embodiment, comprises aluminum oxide ($Al_2O_3$) Other types of non-conductive barrier materials can also be used. A lower barrier layer 389 can be provided between the gates and capacitors to protect, for example, the gate stacks and contacts from oxidizing during high temperature processes, such as an oxygen recovery anneal. The lower barrier layer comprises, for example, $Al_2O_3$ or other barrier materials.

If the first diffusion region of the first or second transistor is not shared with an adjacent memory cell pair, then it indicates an end of the memory group. Depending on which end, it may be coupled to a bitline or a plateline. A selection transistor may be provided to selectively coupled the group to the bitline. The selection transistor can share a diffusion region with the cell transistor.

Figure 4:
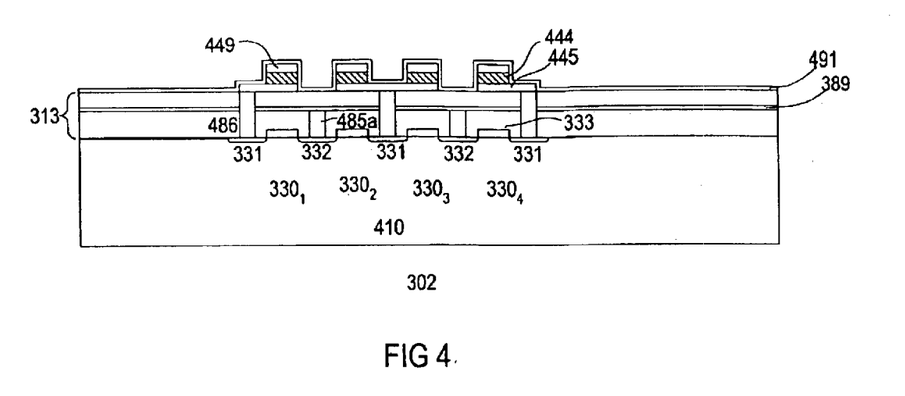
FIGS. 4–8 show a process for forming a memory group in accordance with one embodiment of the invention.

FIGS. 4–8 show a process for forming a memory group in accordance with one embodiment of the invention. Referring to FIG. 4, a semiconductor substrate 410 is provided. The substrate comprises, for example, silicon. Other types of semiconductor substrates are also useful. The substrate is prepared with cell transistors of the memory group. Other components (not shown), such as support circuitry, can also be prepared on the substrate. Illustratively, the memory group comprises 4 memory cells.

A cell transistor 330 comprises a gate 333 and first and second diffusion regions 331 and 332. In one embodiment, adjacent cell transistors share a common diffusion region (331 or 332). For transistors in the middle of the group, both diffusion regions are shared with adjacent cell transistors while the cell transistors at the end of the group each has only one shared diffusion region. The cell transistors, for example, are n-FETs. P-FETS or other types of transistors can also be used. A selection transistor (not shown) can also be provided on the substrate. The selection transistor can share a common diffusion region with a cell transistor on one end of the group.

An ILD layer 313 is provided over the substrate. The ILD, for example, comprises silicon oxide. Other types of dielectric materials, such as silicon nitride, doped or undoped silicate glass, or spin-on glass, are also useful. Various techniques can be used to form the ILD, such as chemical vapor deposition (CVD).

In one embodiment, AACE plugs 485 are formed in two separate processes. The first process forms the lower portions 485a while the second process forms the upper portions. Forming the AACE plugs in two separate processes facilitates filling of the vias since the aspect ratio is reduced. Alternatively, the AACE plugs can be formed in a single process step, for example, after the capacitors are formed.

Lower portions of AACE plugs 485a and AAFE plugs 486 are formed in the ILD layer, coupling to the diffusion regions of the cell transistors. In one embodiment, the AAFE plugs are coupled to the first diffusion regions 331 while the lower portions of AACE plugs are coupled to the second diffusion regions 332. The plugs, for example, comprise a conductive material such as poly-Si. Other types of conductive material, such as tungsten (W), can also be used.

The plugs are formed using conventional techniques. For example, a resist layer is deposited on the ILD layer and patterned to form openings corresponding to vias in which plugs are formed. An anisotropic etch, such as reactive ion etching (RIE), is then performed. The RIE removes portions of the ILD layer exposed by the resist mask, creating vias. A conductive material is then deposited on the substrate, filling the vias. Excess conductive material over the ILD is then removed by, for example, chemical mechanical polishing (CMP). The CMP creates a planar surface between the plugs and ILD.

A liner layer, such as titanium, can be deposited on the substrate to line the via walls prior to filling the vias. The liner layer can be used for silicidation of the substrate material to reduce contact resistance. A barrier, such as titanium nitride, can also be provided to line the via walls. The barrier layer inhibits reaction between the substrate and plug materials. Depending on whether the liner and/or barrier layers are conductive or not, the bottom of the via may be removed to expose the diffusion region.

In one embodiment, the AAFE and lower portions of the AACE plugs are formed by separate processes. The height of the lower portions of the AACE plugs, in one embodiment, is lower than the height of the AAFE plugs. This can be achieved by, for example, depositing a first dielectric layer followed by forming the lower portions of the AACE plugs. Thereafter, a second dielectric layer is deposited and the AAFE plugs are formed. Forming the plugs separately is particularly advantageous since it allows for the different types of plugs to be optimized. Alternatively, the different types of plugs can have the same height or formed during the same process.

In one embodiment, a lower barrier layer 389 is formed on the dielectric layer after the lower portion of AACE plugs are formed. The barrier layer protects the gate stacks and contacts from oxidation from subsequent processes. The barrier layer, for example, comprises aluminum oxide ($Al_2O_3$). Other barrier materials, such as silicon nitride, can also be used.

After the plugs are formed, the process continues to form the first subcapacitors. In one embodiment, the process continues to form ferroelectric capacitors.

In one embodiment, the various layers of the first subcapacitors are deposited on the substrate. For example, a first electrode, first ferroelectric, and second electrode layers 445, 444, and 449 are deposited on the substrate. The electrode layers comprise, for example, platinum and ferroelectric layer comprises PZT. The use of other types of electrode and ferroelectric materials is also useful. In one embodiment, an IrO layer is formed between the electrodes and the ferroelectric layer. In alternative embodiments, the various layers are used to form non-ferroelectric capacitors such as dynamic random access memory (DRAM) capacitors. Conventional techniques, such as CVD, MOCVD, PVD, and spin-on, can be used to form the various capacitor layers.

Prior to forming the first electrode layer, a barrier layer can be deposited on the ILD layer. The barrier layer comprises, for example, iridium. Other materials which can inhibit the diffusion oxygen can also be used. To promote adhesion between the barrier layer and ILD, an adhesion layer can be provided beneath the barrier layer. The adhesion layer comprises, in one embodiment, titanium. Other types of adhesion promoting materials can also be used, including non-conductive materials. For non-conductive materials, the adhesion layer can remain on the ILD except wherein the plugs are located. Various techniques, for example PVD and CVD, can be used to form the barrier and adhesion layers.

For applications where the plug comprises poly-Si, a metal silicide layer can be formed over the ILD prior to the capacitor layers. The metal silicide, for example comprises titanium or cobalt. Other metal suicides are also useful. The metal silicide can be formed by conventional techniques.

In one embodiment of the invention, the first subcapacitor layers are patterned in two separate processes. The first process patterns the ferroelectric and second electrode layers, forming the upper portion of the first subcapacitors. The second process patterns the first electrode layer. Conventional mask and etch techniques can be used to pattern the layers. For example, a hard mask is deposited on the top capacitor layer. The hard mask, in one embodiment, comprises $SiO_2$. Other hard mask material is also useful. A photoresist layer is deposited on the hard mask layer. An antireflective (ARC) layer can be formed beneath the photoresist. The photoresist layer is patterned, leaving a resist block to protect the hard mask layer in regions corresponding to the area of the capacitor. An anisotropic etch, such as an RIE, is used to remove the exposed portions of the hard mask layer to expose the top capacitor layer. The resist is removed after the hard mask is patterned. An RIE is then performed to remove the layers beneath.

In an alternative embodiment, the first subcapacitors can be formed by depositing and patterning the first electrode layer (including layers beneath such as the barrier and adhesion layers, if present), and then depositing and patterning the ferroelectric and second layers. Other techniques for forming the first subcapacitors are also useful.

After the first subcapacitors are formed, an encapsulation layer 491 is deposited on the substrate. The encapsulation layer covers the capacitors and ILD layer. In one embodiment the encapsulation layer comprises $Al_3O_2$. Other types of materials which are good insulators and have good barrier properties, such as SiN or $TiO_2$ are also useful.

Figure 5:
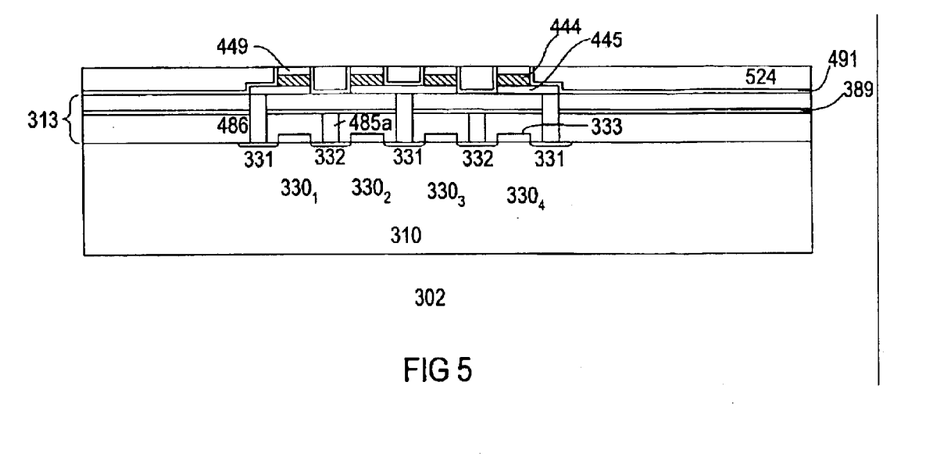

Referring to FIG. 5, a dielectric layer 524 is deposited on the substrate, covering the first subcapacitors. The substrate is then polished by, for example, chemical machanical polish (CMP). The CMP removes excess dielectric material and the encapsulation layer above the second electrodes. This exposes the second electrodes on the substrate.

Figure 6:
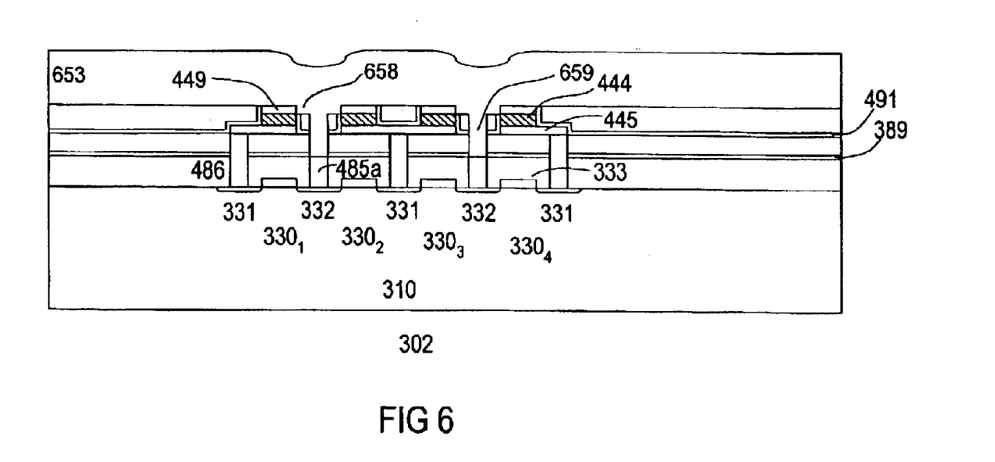

In FIG. 6, the substrate is patterned to form contact openings 659 to the lower portions of the AACE plugs. The contact openings serve to form the upper portions of the AACE plugs. Alternatively, for applications where the AACE plugs are formed in a single process, the openings are formed to expose the first diffusion regions of the transistors. Channels 658 are then formed in the dielectric layer in the upper portion of the openings 659. The channels are used to form the interconnections between the second electrodes (common electrode) of the two capacitors within a memory cell pair. A conductive material 653 is deposited on the substrate, filling the contact openings and channels. The conductive material, for example, comprises tungsten. Other conductive materials are also useful.

Figure 7:
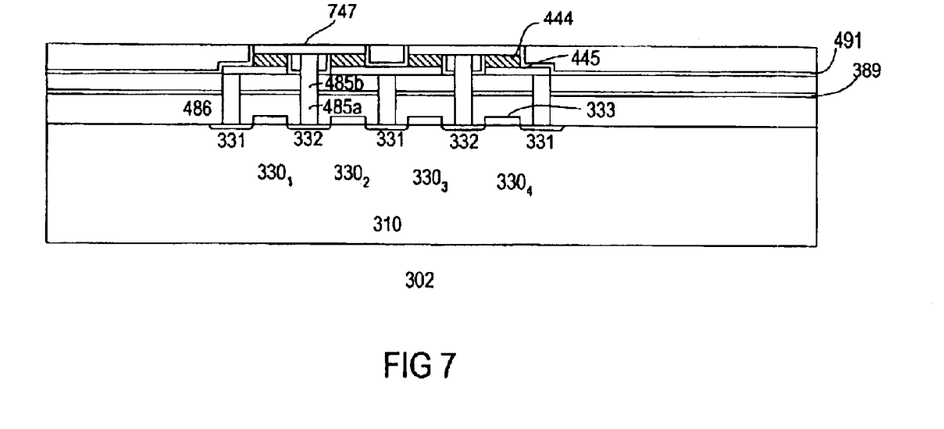
Figure 8:
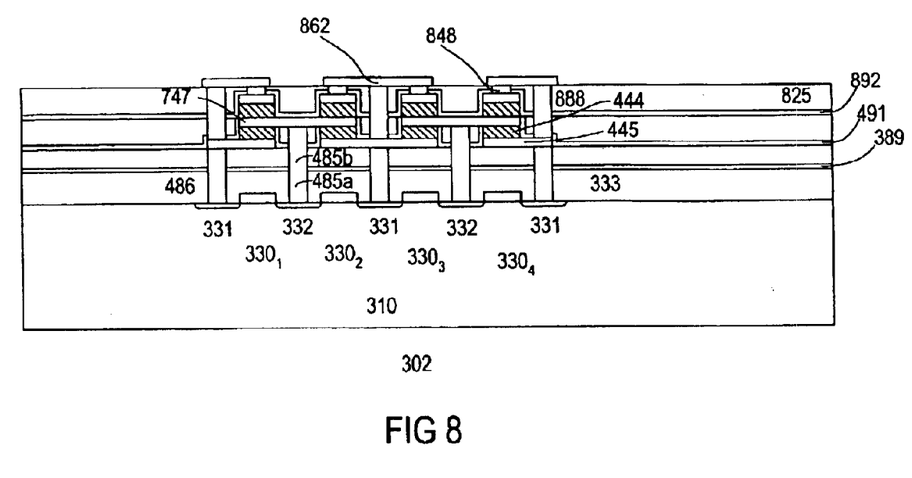

In FIG. 7, the substrate is polished, removing the excess conductive materials. In one embodiment, the polishing step forms the upper portion 485b of the AACE plugs and the interconnection to create the common electrode 747 of the capacitors of the memory cell pair. The process continues, as shown in FIG. 8, to form the second subcapacitors. For example, second ferroelectric and third electrode layers are deposited. In one embodiment, the ferroelectric layer comprises PZT and the electrode layer comprises platinum. Other ferroelectric and electrode materials are also useful. Preferably, an IrO layer is deposited between the ferroelectric and third electrode layer. The various layers are then patterned to form the second subcapacitors. An encapsulation layer 892, for example $Al_2O_3$, and dielectric layer 825 are deposited on the substrate to cover the capacitors.

The process continues to form interconnections between the first and third electrodes. In one embodiment, TE plugs 848 and UFE plugs 888 are formed in the dielectric layer. The TE and UFE plugs, for example, are formed using separate processes. Forming the plugs in the same process can also be useful. After the plugs are formed, a conductive layer 862 is deposited and patterned to form conductive strips to couple the TE and UFE plugs. The conductive layer, in one embodiment, comprises aluminum. Other conductive materials, such as tungsten, TiN, Ti, Cu, are also useful. Various conventional techniques can be used to form the contacts and conductive strips, for example, damascene, dual damascene, or RIE.

While the invention has been particularly shown and described with reference to various embodiments, it will be recognized by those skilled in the art that modifications and changes may be made to the present invention without departing from the spirit has scope thereof. The scope of the invention should therefore be determined not with reference to the above description but with reference to the appended claims along with their full scope of equivalents.

What is claimed is:

1. An integrated circuit comprising:
    a plurality of memory calls coupled in series to form a series group, wherein a memory cell comprises
        a transistor having a gate and first and second diffusion regions,
        a capacitor coupled to the transistor in parallel,
        the capacitor includes first, second, and third electrodes separated by first and second capacitor dielectric layers to form first and second subcapacitors, the first subcapacitor being located below the second subcapacitor, wherein the second electrode is a common electrode of the first and second subcapacitors, and
        one of the first, second and third electrodes is coupled to the second diffusion region and the other two of the first, second, and third electrodes are coupled to the first diffusion region;
    a first encapsulation layer covering sidewalls of the first subcapacitor and a top surface of a first interlevel dielectric layer having a top planar surface located substantially in plane with a bottom surface of a bottom electrode of the first subcapacitor; and
    a second encapsulation layer covering sidewalls of the second subcapacitor and a top surface of a second interlevel dielectric layer having a top surface substantially in plane with a top surface of the common electrode of the first and second subcapacitors.

2. The integrated circuit of claim 1 wherein the second electrode is coupled to the second diffusion region and the first and third electrodes are coupled to the first diffusion region.

3. The integrated circuit of claim 1 wherein the memory cells comprise ferrolectric memory cells.

4. The integrated circuit of claim 3 wherein the second electrode is coupled to the second diffusion region and the first and third electrodes are coupled to the first diffusion region.

5. The integrated circuit of claim 1, 2, 3 or 4 wherein the plurality of memory cells are arranged in pair wherein a pair of memory cells comprises:
    a first memory cell having a first transistor coupled to a first capacitor;
    a second memory cell having a second transistor coupled to a second capacitor;
    the second diffusion region of the first transistor and the second diffusion region of the second transistor form a common second diffusion region;
    the one electrode of the first capacitor and the one electrode of the second capacitor are commonly coupled to the common second diffusion region;
    the other two electrodes of the first capacitor are coupled to the first diffusion region of the first transistor; and
    the other two electrodes of the second capacitor are coupled to the first diffusion region of the second transistor.

6. The integrated circuit of claim 5 wherein the first diffusion region of first transistor and the first diffusion region of the second transistors of adjacent memory cell pairs form a common first diffusion region of adjacent cell pairs.

7. The integrated circuit of claim 6 wherein:
    the one electrode of the first capacitor and the one electrode of the second capacitor of the capacitor pair is a common electrode; and
    the other two electrodes of the first and second capacitors of adjacent memory cell pairs arm commonly coupled.

8. The integrated circuit of claim 7 wherein one of the other two electrodes of the first and second capacitors of adjacent memory cell pairs is a common one electrode of the first and second capacitors of adjacent memory pairs.

9. The integrated circuit of claim 8 wherein the common one electrode of the first and second capacitors of adjacent memory cell pairs is the first electrode located below the second and third electrodes.

10. The integrated circuit of claim 5 wherein:
    the one electrode of the first capacitor and the one electrode of the second capacitor of the capacitor pair is a common one electrode; and
    the other two electrodes of the first and second capacitors of adjacent memory cell pairs are commonly coupled.

11. The integrated circuit of claim 10 wherein one of the other two electrodes of the first and second capacitors of adjacent memory cell pairs is a common one electrode of the first and second capacitors of adjacent memory pairs.

12. The integrated circuit of claim 11 wherein the common one electrode of the first and second capacitors of adjacent memory cell pairs is the second electrode located between the first and third electrodes.

13. The integrated circuit of claim 1 wherein the capacitor includes at least first, second, and third electrodes separated by at least first and second capacitor dielectrics layers to form at least first and second subcapacitors.

14. The integrated circuit of claim 13 wherein the memory cells comprise ferroelectric memory cells.

* * * * *